(12) United States Patent
Anholt et al.

(10) Patent No.: US 8,773,904 B2
(45) Date of Patent: Jul. 8, 2014

(54) OPTIMIZED THRESHOLD SEARCH IN ANALOG MEMORY CELLS

(75) Inventors: Micha Anholt, Tel Aviv (IL); Naftali Sommer, Rishon le-Zion (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/595,571

(22) Filed: Aug. 27, 2012

(65) Prior Publication Data

US 2013/0170272 A1 Jul. 4, 2013

Related U.S. Application Data

(60) Provisional application No. 61/580,673, filed on Dec. 28, 2011.

(51) Int. Cl.
*G11C 16/04* (2006.01)

(52) U.S. Cl.
USPC ............. 365/185.03; 365/185.18; 365/185.25

(58) Field of Classification Search
USPC ........................... 365/185.03, 185.18, 185.25
See application file for complete search history.

(56) References Cited

U.S. PATENT DOCUMENTS

| | | | |
|---|---|---|---|
| 7,697,326 B2 * | 4/2010 | Sommer et al. ......... | 365/185.03 |
| 7,821,826 B2 * | 10/2010 | Shalvi et al. ............ | 365/185.03 |
| 7,900,102 B2 | 3/2011 | Sokolov et al. | |
| 7,975,192 B2 | 7/2011 | Sommer et al. | |
| 8,000,135 B1 | 8/2011 | Perlmutter et al. | |
| 8,000,141 B1 * | 8/2011 | Shalvi et al. ............ | 365/185.09 |
| 8,072,812 B2 * | 12/2011 | Roohparvar et al. .... | 365/185.17 |
| 8,527,819 B2 * | 9/2013 | Shalvi et al. ............ | 714/710 |
| 2009/0043951 A1 | 2/2009 | Shalvi et al. | |
| 2009/0199074 A1 | 8/2009 | Sommer | |
| 2010/0091535 A1 | 4/2010 | Sommer et al. | |
| 2011/0161775 A1 | 6/2011 | Weingarten | |
| 2011/0258495 A1 | 10/2011 | Tseng et al. | |

FOREIGN PATENT DOCUMENTS

| | | |
|---|---|---|
| JP | 2011100519 | 5/2011 |
| JP | 2011165301 | 8/2011 |

OTHER PUBLICATIONS

International Search Report and Written Opinion in application No. PCT/US12/65765 mailed Feb. 7, 2013 pp. 1-15.
Extended Search Report in European Application No. 12193775.9-1805, May 8, 2013, pp. 1-8.
Notice of Preliminary Rejection from Korean Patent Application No. 10-2012-154383, mailed Feb. 12, 2014, English and Korean versions, pp. 1-8.
Office Action from Japanese Patent Application No. 2012-289484, mailed Dec. 26, 2014, English and Japanese versions, pp. 1-5.

\* cited by examiner

*Primary Examiner* — Pho M Luu
(74) *Attorney, Agent, or Firm* — Meyertons, Hood, Kivlin, Kowert & Goetzel, P.C.

(57) ABSTRACT

A method includes storing data in a group of analog memory cells. The memory cells in the group are read using first read thresholds to produce first readout results, and re-read using second read thresholds to produce second readout results. Third read thresholds, which include at least one of the first read thresholds and at least one of the second read thresholds, are defined. Readout performance of the first, second and third read thresholds is evaluated based on the first and second readout results. The first, second or third read thresholds are selected based on the evaluated readout performance, and data recovery is performed using the selected read thresholds.

28 Claims, 3 Drawing Sheets

US 8,773,904 B2

OPTIMIZED THRESHOLD SEARCH IN ANALOG MEMORY CELLS

CROSS-REFERENCE TO RELATED APPLICATIONS

This application claims the benefit of U.S. Provisional Patent Application 61/580,673, filed Dec. 28, 2011, whose disclosure is incorporated herein by reference.

FIELD OF THE INVENTION

The present invention relates generally to memory devices, and particularly to methods and systems for setting thresholds for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Various techniques for setting read thresholds and other read parameters for reading analog memory cells are known in the art. For example, U.S. Patent Application Publication 2009/0199074, whose disclosure is incorporated herein by reference, describes a method for operating a memory that includes analog memory cells. The method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

SUMMARY OF THE INVENTION

An embodiment of the present invention that is described herein provides a method including storing data in a group of analog memory cells. The memory cells in the group are read using first read thresholds to produce first readout results, and re-read using second read thresholds to produce second readout results. Third read thresholds, which include at least one of the first read thresholds and at least one of the second read thresholds, are defined. Readout performance of the first, second and third read thresholds is evaluated based on the first and second readout results. The first, second or third read thresholds are selected based on the evaluated readout performance, and data recovery is performed using the selected read thresholds.

In some embodiments, performing the data recovery comprises recovering the data stored in the group of the memory cells, or recovering the data stored in a different group of the memory cells. In an embodiment, evaluating the readout performance includes deriving from the first and second readout results third readout results that would be produced by reading the memory cells in the group using the third read thresholds, and assessing the readout performance based on the third readout results.

In a disclosed embodiment, deriving the third readout results includes dividing the memory cells in the group into first and second subsets based on readout from the group using one or more auxiliary read thresholds, and forming the third readout results by selecting the first readout results read from the memory cells in the first subset, and the second readout results read from the memory cells in the second subset. In an embodiment, the auxiliary read thresholds include the first or the second set of read thresholds.

In another embodiment, the stored data is encoded with an Error Correction Code (ECC), and evaluating the readout performance includes dividing the memory cells in the group into first and second subsets, computing a first partial syndrome of the ECC based on the first readout results read from the memory cells in the first subset while nullifying the first readout results read from the memory cells in the second subset, computing a second partial syndrome of the ECC based on the second readout results read from the memory cells in the second subset while nullifying the second readout results read from the memory cells in the first subset, computing a third syndrome of the ECC, corresponding to third readout results that would be produced by reading the memory cells in the group using the third read thresholds, by summing the first and second partial syndromes, and evaluating the readout performance by comparing a first syndrome computed over the first readout results, a second syndrome computed over the second readout results, and the third syndrome. In an embodiment, dividing the memory cells in the group into the first and second subsets includes defining the first and second subsets based on readout from the group using one or more auxiliary read thresholds.

In yet another embodiment, the stored data is encoded with an ECC that is defined by a set of parity check equations, and evaluating the readout performance includes calculating a respective count of the parity check equations that are satisfied by the first readout results, the second readout results and third readout results that would be produced by reading the memory cells in the group using the third read thresholds. In still another embodiment, the stored data is encoded with an ECC, and evaluating the readout performance includes evaluating a success or failure to decode the ECC based on the first, second and third read thresholds.

In a disclosed embodiment, the stored data is encoded with an ECC, and evaluating the readout performance includes evaluating an interim result of a decoding process that decodes the ECC based on the first, second and third read thresholds. Evaluating the interim result may include calculating a rank of an error locator polynomial of the ECC.

In an embodiment, the ECC includes a composite ECC comprising multiple auxiliary ECCs, and evaluating the interim result includes evaluating a decoding result of only a subset of the auxiliary ECCs. In another embodiment, the analog memory cells are included in a memory device, and reading and re-reading the memory cells include receiving and performing in the memory device a single read command that reads the memory cells using both the first and the second read thresholds.

There is additionally provided, in accordance with an embodiment of the present invention, apparatus including a memory and storage circuitry. The memory includes multiple analog memory cells. The storage circuitry is configured to store data in a group of the analog memory cells, to read the memory cells in the group using first read thresholds so as to produce first readout results, to re-read the memory cells in the group using second read thresholds so as to produce second readout results, to define third read thresholds that include at least one of the first read thresholds and at least one of the second read thresholds, to evaluate readout performance of the first, second and third read thresholds based on the first and second readout results, to select the first, second or third read thresholds based on the evaluated readout performance, and to perform data recovery using the selected read thresholds.

There is also provided, in accordance with an embodiment of the present invention, apparatus including an interface and storage circuitry. The interface is configured to communicate with a memory that includes multiple analog memory cells. The storage circuitry is configured to store data in a group of the analog memory cells, to read the memory cells in the group using first read thresholds so as to produce first readout results, to re-read the memory cells in the group using second read thresholds so as to produce second readout results, to define third read thresholds that include at least one of the first read thresholds and at least one of the second read thresholds, to evaluate readout performance of the first, second and third read thresholds based on the first and second readout results, to select the first, second or third read thresholds based on the evaluated readout performance, and to perform data recovery using the selected read thresholds.

The present invention will be more fully understood from the following detailed description of the embodiments thereof, taken together with the drawings in which:

DETAILED DESCRIPTION OF EMBODIMENTS

Overview

Figure 1:
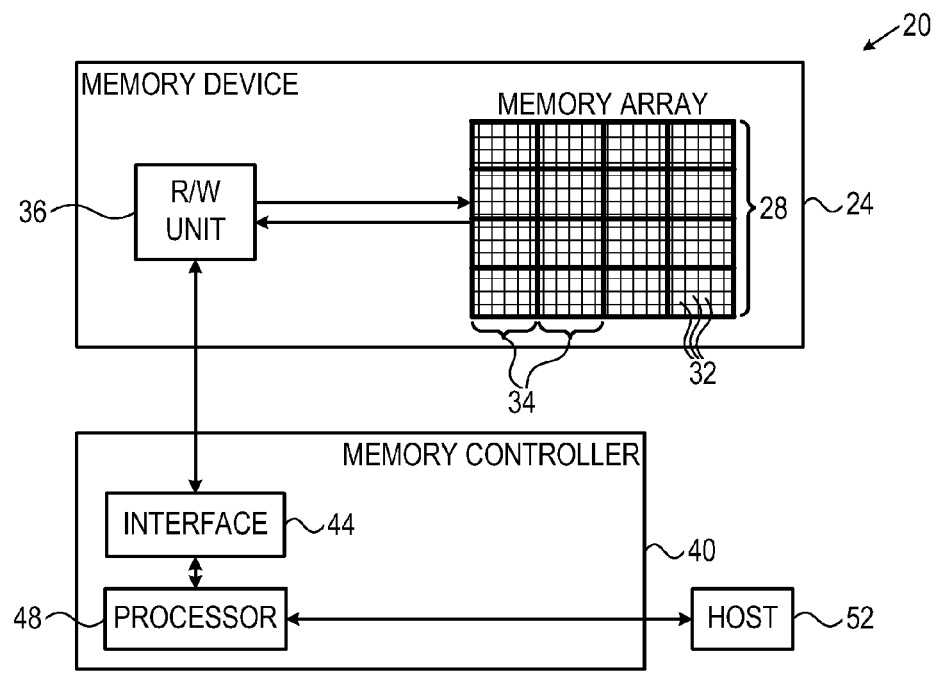
FIG. 1 is a block diagram that schematically illustrates a memory system, in accordance with an embodiment of the present invention.

Data is typically stored in analog memory cells by writing into the cells respective analog storage values that represent the data. The range of analog storage values is typically divided into regions, referred to as programming levels, which represent the possible data values. The analog memory cells are typically read by comparing their analog storage values to certain read thresholds that are positioned at the boundaries between adjacent programming levels.

In many practical cases, the analog storage values of the memory cells vary over time and from one memory cell group to another. Therefore, it is important to track and position the read thresholds with high accuracy. Accurate positioning of read thresholds has a considerable impact on the probability of read errors.

On the other hand, evaluation of multiple sets of read thresholds may incur considerable latency and power consumption, for example because this task involves a large number of read operations from the memory cells. The evaluation of read thresholds becomes particularly complex when using high-order MLC that store large numbers of bit per cell.

Embodiments of the present invention that are described herein provide improved methods and systems for evaluating read thresholds. The disclosed techniques evaluate the readout performance of multiple sets of read thresholds while actually reading the memory cells using only a small subset of these sets. The readout performance of the remaining sets of read thresholds is evaluated by computation, without actually reading the memory cells. As a result, the latency and power consumption incurred by the threshold evaluation process is reduced considerably. The best-performing set of read thresholds is then used for recovering the stored data.

In some embodiments, a group of analog memory cells is read using first and second sets of read thresholds, to produce first and second readout results, respectively. A third set of read threshold, referred to as a hybrid set, is formed by selecting at least one read threshold from the first set and at least one read threshold from the second set. The readout performance of the first, second and third sets is evaluated based on the first and second readout results, and the best-performing set is selected for decoding the stored data. Alternatively, the best-performing set is used for decoding the data in another group of memory cells.

In particular, the readout performance of the hybrid set is evaluated without reading the memory cells using this set. This sort of scheme can be used to evaluate all possible combinations of read thresholds selected from a small number of initial sets.

Several example schemes for evaluating the readout performance of such a hybrid set are described herein. In one embodiment, the readout results of the hybrid set are reproduced (by computation without reading the memory cells) by selecting corresponding readout results from the first or the second readout results, on a cell-by-cell basis. The decision whether to select the readout results from the first or the second readout results is made, cell-by-cell, depending on the respective results of an auxiliary read operation that uses one or more auxiliary thresholds.

In an alternative embodiment, the data stored in the group of memory cells is encoded with an Error Correction Code (ECC), such as a Low Density Parity Check (LDPC) code. The group of memory cells is partitioned into subsets based on the results of an auxiliary read operation or other suitable criterion. After reading the memory cells using the first set of read thresholds, a respective partial syndrome of the ECC is calculated for each subset of the memory cells. The process is repeated for the readout results obtained using the second set of read thresholds, to produce partial syndromes for this set, as well.

The readout performance of the first, second and third (hybrid) sets of read thresholds are evaluated by summing (modulo-2, i.e., XORing) appropriate combinations of the partial syndromes. In some embodiments, only the partial syndromes associated with the various sets of read thresholds are retained, and the raw readout results are discarded. Thus, the memory space required by the threshold evaluation process is reduced considerably.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for selecting read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller and R/W circuitry 36 are referred to jointly as storage circuitry that carries out the disclosed techniques.

Figure 2:
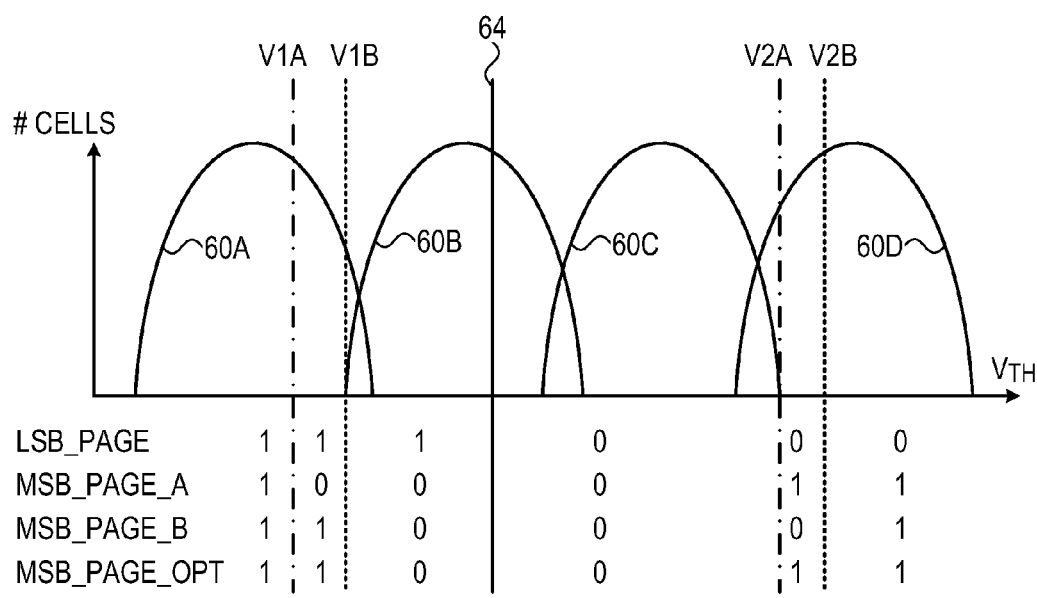
FIGS. 2 and 3 are diagrams that schematically illustrate schemes for selecting optimal read thresholds, in accordance with embodiments of the present invention.

FIG. 2 is a diagram that schematically illustrates a scheme for selecting optimal read thresholds, in accordance with an embodiment of the present invention. In the present embodiment, memory cells 32 comprise four-level MLC, each holding two data bits. In alternative embodiments, the disclosed techniques can be used for selecting read thresholds for reading any other suitable type of MLC, such as eight-level or sixteen-level MLC.

In the example of FIG. 2, a group of memory cells, typically along a given word line, holds two data pages—A page referred to as Least Significant Bit (LSB) page in the first bit of the memory cells in the group, and another page referred to as Most Significant Bit (MSB) page in the second bit of the memory cells in the group.

The figure shows the threshold voltage ($V_{TH}$) distribution in the memory cells in the group. In this example, the threshold voltage is distributed in four distributions 60A ... 60D that correspond to four respective programming levels. Each programming level represents a respective combination of two bits—An LSB and an MSB:

TABLE 1

Example mapping of LSB and MSB to programming levels

| Programming level | LSB | MSB |
|---|---|---|
| 60A | 1 | 1 |
| 60B | 1 | 0 |
| 60C | 0 | 0 |
| 60D | 0 | 1 |

This mapping uses Gray coding, in which any two adjacent programming levels differ from one another by only a single bit value. Moreover, in this mapping the lowest two programming levels correspond to LSB="1", and the highest two programming levels correspond to LSB="0".

Typically, R/W unit 36 reads the LSB page by comparing the cell threshold voltages to an LSB read threshold 64. Memory cells whose threshold voltage falls below threshold 64 are regarded as holding LSB="1", and memory cells whose threshold voltage falls above threshold 64 are regarded as holding LSB="0".

Unit 36 typically reads the MSB page by comparing the cell threshold voltages to a pair of MSB read thresholds V1A and V2A, or to a pair of MSB read thresholds V1B and V2B. Memory cells whose threshold voltage falls between V1A and V2A (or between V1B and V2B) are regarded as holding MSB="0", and memory cells whose threshold voltage falls below threshold V1A or above threshold V2A (or, alternatively, below threshold V1B or above threshold V2B) are regarded as holding LSB="1".

In practice, the shapes and positions of distributions 60A ... 60D may vary over time and from one group of memory cells to another. Accurate positioning of the read thresholds has a considerable impact on the probability of read errors, especially when the programming level distributions are closely spaced or even partially overlapping. Since the boundary regions between distributions vary over time and between memory cell groups, the read threshold positions should typically be adjusted in an adaptive manner.

Read Threshold Search with Reduced Number of Read Operations

As can be seen in FIG. 2, each MSB readout operation involves comparison with a pair of read thresholds. In order to find the optimal positions of the MSB read thresholds, it is typically necessary to evaluate multiple candidate pairs of read thresholds and choose the best-performing pair.

An exhaustive search over multiple pairs of thresholds may involve a large number of readout operations in which the memory cell threshold voltages are sensed and compared to the thresholds of each pair, and may therefore incur considerable latency and power consumption. In some embodiments that are described herein, memory controller 40 evaluates the readout performance of multiple sets of read thresholds, while performing only a small number of read operations from memory cells 32. As a result, processing time and power consumption are reduced.

In the present example, the memory controller reads the memory cells in the group twice—Using the read threshold pair {V1A,V2A} and using the read threshold pair {V1B, V2B}. Based on the results of these two readout operations, the memory controller evaluates the readout performance of two additional pairs of read thresholds—{V1A,V2B} and {V1B,V2A}, without reading the memory cells using these read threshold pairs. Thus, the number of read operations is reduced by half in comparison with a conventional readout of {V1A,V2A}, {V1B,V2B}, {V1A,V2B} and {V1B,V2A}.

The sets of read thresholds with which the memory cells are actually read (pairs {V1A,V2A} and {V1B,V2B} in this example) are referred to herein as explicit sets of thresholds or simply explicit thresholds. The additional sets of thresholds (pairs {V1A,V2B} and {V1B,V2A} in this example), which are computed based on the explicit threshold, are referred to herein as hybrid sets of read thresholds, or hybrid thresholds for brevity.

After evaluating the readout performance of the various read threshold pairs, including the explicit thresholds and the hybrid thresholds, the memory controller selects the pair of read thresholds that exhibits the best readout performance.

The selected pair of read thresholds (either explicit or hybrid) is used for recovering the data stored in the group of memory cells.

For a 2 bits/cell memory, the disclosed techniques can use the readout results of N read operations (N sets of explicit thresholds) to estimate the readout performance of $N^2$ pairs of read threshold combinations ($N^2$ sets of hybrid thresholds). When evaluating a larger number of threshold pairs, or when using higher-order MLC, the reduction in the number of read operations is considerably higher.

The example of FIG. 2 demonstrates the effectiveness of this technique. In this example, the two pairs of explicit thresholds ({V1A,V2A} and {V1B,V2B}) are not positioned optimally in the boundaries between the threshold voltage distributions. The hybrid pair {V1B,V2A}, however, is much better positioned. Even though the memory cells are never actually read using the hybrid pair {V1B,V2A}, the memory controller evaluates its readout performance from the readout results of the explicit threshold pairs {V1A,V2A} and {V1B,V2B}. The memory controller is then able to select the hybrid pair {V1B,V2A} for subsequent data recovery.

In the example of FIG. 2, memory controller 40 uses the readout results of the explicit pairs ({V1A,V2A} and {V1B,V2B}) to artificially construct the readout results of the hybrid pairs ({V1A,V2B} and {V1B,V2A}) without actually reading the memory cells using the hybrid pairs. For this purpose, the memory controller reads the memory cells using one or more auxiliary thresholds.

In some embodiments, LSB threshold 64 serves as an auxiliary threshold. The readout results of auxiliary threshold 64 ("0" or "1") are denoted LSB_PAGE in the figure, and are shown as a function of the $V_{TH}$ interval in which the cell threshold voltage falls.

The MSB readout results of explicit pair {V1A,V2A} are shown on the following line, denoted MSB_PAGE_A. The next line, marked MSB_PAGE_B, shows the readout results of explicit pair {V1B,V2B}. Note that in two intervals (V1A<$V_{TH}$<V1B and V2A<$V_{TH}$<V2B) there is a disagreement between the readout results of the explicit pairs.

In this embodiment, the memory controller constructs the artificial readout results of hybrid pair {V1B,V2A} from the readout results of the two explicit pairs of read thresholds, using the readout results of the auxiliary threshold 64. The artificial readout results of hybrid pair {V1B,V2A} are shown at the bottom of FIG. 2, marked MSB_PAGE_OPT. When the respective readout results of the explicit pairs agree (i.e., both "0" or both "1") the memory controller sets the corresponding readout result of the hybrid pair to this value. When the respective readout results of the explicit pairs disagree, the memory controller sets the corresponding readout result of the hybrid pair to one of these values, depending on the corresponding readout result of the auxiliary threshold.

Because of the mapping of bits to programming levels (Table 1 above), the bits of LSB_PAGE indicate which memory cells have threshold voltages that fall on the left-hand-side of threshold 64 (LSB_PAGE="1") and which have threshold voltages that fall on the right-hand-side of threshold 64 (LSB_PAGE="0").

Thus, in order to recreate the readout results of {V1B, V2A}, the memory controller sets the readout result of MSB_PAGE_OPT to the corresponding readout result of MSB_PAGE_A if the corresponding LSB_PAGE readout result is "0" (imitating a comparison to V2A). If, on the other hand, the LSB_PAGE readout result is "1", the memory controller sets the readout result of MSB_PAGE_OPT to the corresponding readout result of MSB_PAGE_B (imitating a comparison to V1B).

The above logic reconstructs the exact readout results that would be produced by reading the memory cells in the group using the hybrid thresholds {V1B,V2A} (other than the possible effects of read noise) without actually reading the memory cells using this hybrid pair. The artificial readout results of the second hybrid pair {V1A,V2B}) can be constructed in a similar manner.

Note that this technique is not sensitive to the accuracy with which LSB threshold 64 is positioned, because threshold voltages that are close to LSB threshold 64 are far from any of the MSB thresholds (and therefore their bit values are the same in MSB_PAGE_A and MSB_PAGE_B). As can be seen in the figure, threshold 64 is not positioned optimally between programming levels 60B and 60C. Nevertheless, the construction of the artificial MSB_PAGE_OPT readout results is still accurate.

The disclosed technique can be used in a similar manner with sets of more than two read thresholds. Consider, for example, a group of 3 bits/cell memory cells storing an LSB page, a Center Significance Bit (CSB) page and an MSB page using the following bit mapping and read threshold configuration:

TABLE 2

Example 3 bits/cell configuration

| Programmed pages | Data value | $V_{TH}$ range |
|---|---|---|
| LSB | "1" | $V_{TH} < RV_{11}$ |
|  | "0" | $V_{TH} > RV_{11}$ |
| LSB, CSB | "11" | $V_{TH} < RV_{21}$ |
|  | "10" | $RV_{21} < V_{TH} < RV_{22}$ |
|  | "00" | $RV_{22} < V_{TH} < RV_{23}$ |
|  | "01" | $V_{TH} > RV_{23}$ |
| LSB, CSB, MSB | "111" | $V_{TH} < RV_{31}$ |
|  | "110" | $RV_{31} < V_{TH} < RV_{32}$ |
|  | "100" | $RV_{32} < V_{TH} < RV_{33}$ |
|  | "101" | $RV_{33} < V_{TH} < RV_{34}$ |
|  | "001" | $RV_{34} < V_{TH} < RV_{35}$ |
|  | "000" | $RV_{35} < V_{TH} < RV_{36}$ |
|  | "010" | $RV_{36} < V_{TH} < RV_{37}$ |
|  | "011" | $V_{TH} > RV_{37}$ |

In this example, the MSB page is read using a set of four MSB thresholds denoted {$RV_{31}$,$RV_{33}$,$RV_{35}$,$RV_{37}$}. Assume that the MSB page is read twice using two explicit sets of thresholds {V1A,V2A,V3A,V4A} and {V1B,V2B,V3B,V4B}. In order to construct the readout results of a hybrid set {V1A,V2B,V3A,V4B}, the memory controller may first read the LSB and the CSB pages (where low accuracy of the read thresholds is sufficient, as described above). Then, the value of the LSB and CSB (auxiliary thresholds) determines for each cell which is the relevant MSB threshold (V1,V2,V3 or V4).

According to the value of the LSB and CSB bits, the memory controller selects either the bit from the first or second MSB read operation. For example, if a cell has LSB and CSB bits of "0", then the relevant threshold is $RV_{35}$→V3. Since the memory controller needs the artificial readout results to use V3A, it will select the result of the first readout. If a cell has an LSB bit of "0" and a CSB bit of "1", then the relevant threshold is $RV_{37}$→V4. Since the memory controller needs the artificial readout results to use V4B, we will select the result of the second readout.

In some embodiments, the read threshold values in the various explicit sets are unique. In alternative embodiments, however, multiple explicit and/or hybrid sets may use a given threshold value.

Note that, in many practical cases, the auxiliary read thresholds do not require additional read operations. In the configuration of FIG. 2, for example, the normal LSB readout used for recovering the LSB page data can be re-used as auxiliary threshold readout. In the 3 bits/cell example, too, normal LSB and CSB readout operations can be re-used as auxiliary threshold readout.

Figure 3:
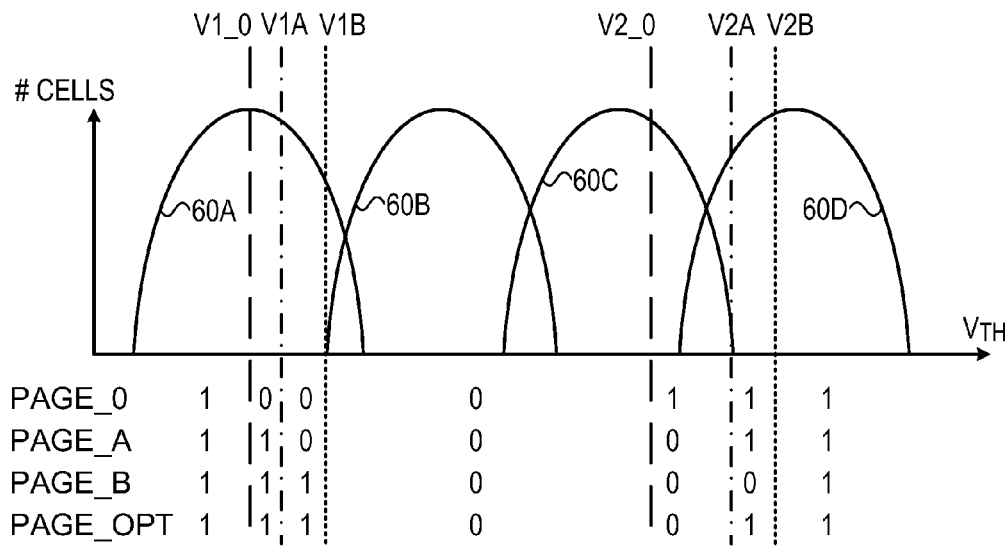

FIG. 3 is a diagram that schematically illustrates a scheme for selecting optimal read thresholds, in accordance with an alternative embodiment of the present invention. In the scheme of FIG. 2 above, the memory controller generated the artificial readout results for the hybrid threshold sets using one or more auxiliary thresholds. In the scheme of FIG. 3, on the other hand, one of the explicit sets of read thresholds serves as the auxiliary thresholds.

In the example of FIG. 3, memory controller 40 reads the group of memory cells using three explicit sets of read thresholds denoted {V1_0,V2_0}, {V1A,V2A} and {V1B,V2B}, so as to generate three pages denoted PAGE_0, PAGE_A and PAGE_B, respectively. From the readout results of these three read operations, the memory controller recreates the artificial readout results of all nine possible combinations threshold pairs (i.e., produces six artificial readout results for six hybrid threshold pairs).

In this embodiment, the memory controller uses one of the explicit pairs (in this example {V1_0,V2_0}) as the auxiliary thresholds. This technique can be used, for example, if the LSB page is not available. One advantage of this technique is that it eliminates the need for a dedicated read operation using the auxiliary thresholds, and instead reuses the read results of one of the explicit pairs. As a result, better throughput can be achieved.

The description that follows assumes that the lowest among the explicit thresholds are chosen to serve as the auxiliary thresholds, i.e., that $V1\_0 \le V1A$, $V1\_0 \le V1B$, $V2\_0 \le V2A$ and $V2\_0 \le V2B$. In alternative embodiments, however, the highest among the explicit thresholds may be chosen to serve as the auxiliary thresholds.

In an embodiment, in order to artificially generate the readout results of hybrid pair {V1B,V2A} (denoted PAGE_OPT in the figure), the memory controller applies the following logic:
- For memory cells in which PAGE_0="0", set the corresponding readout result in PAGE_OPT to be the readout result of PAGE_B.
- For memory cells in which PAGE_0="1", set the corresponding readout result in PAGE_OPT to be the readout result of PAGE_A.

In order to artificially generate the readout results of hybrid pair that mixes a threshold from {V1_0,V2_0} with a threshold from {V1A,V2A}, the memory controller may still use PAGE_0 (the readout results of {V1_0,V2_0}) to serve as auxiliary thresholds. Thus, the three readout operations {V1_0,V2_0}, {V1A,V2A} and {V1B,V2B} can be used to produce a total of nine sets of readout results.

As yet another example, consider the case of two explicit read operations, in which the memory controller generates four possible combinations. The memory controller may read the group of memory cells using {V1_0,V2_0} and {V1A, V2A}, and use PAGE_0 as the auxiliary threshold. In this case, the thresholds should be ordered (without loss of generality) such that $V1\_0 \le V1A$ and $V2\_0 \le V2A$.

Figure 4:
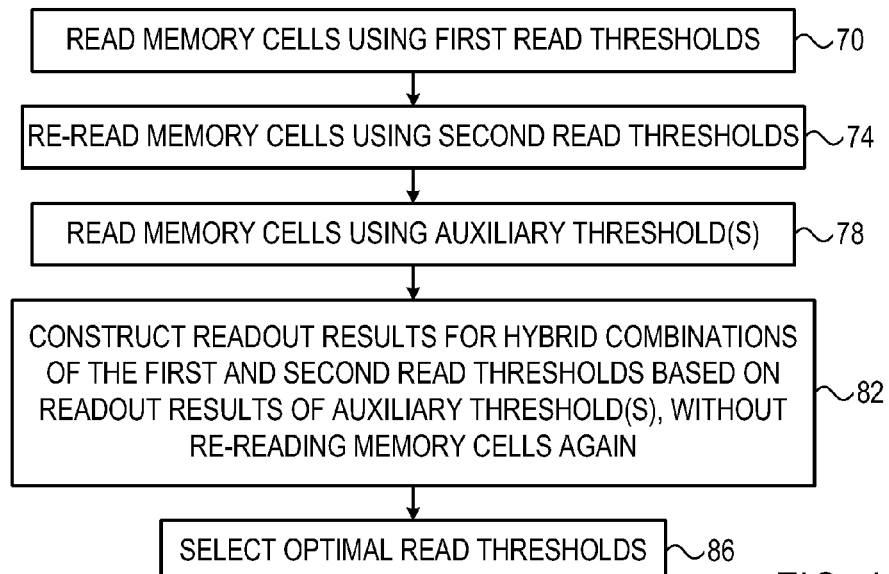
FIGS. 4 and 5 are flow charts that schematically illustrate methods for selecting optimal read thresholds, in accordance with embodiments of the present invention.

FIG. 4 is a flow chart that schematically illustrates a method for selecting optimal read thresholds, in accordance with an embodiment of the present invention. The method begins with memory controller 40 reading a group of analog memory cells 32 using first explicit read thresholds, at a first readout step 70. The memory controller re-reads the same group of memory cells using second explicit read thresholds, at a second readout step 74.

The memory controller reads the group of memory cells using one or more auxiliary thresholds, at an auxiliary readout step 78. As explained above, the memory controller may reuse one of the explicit readout operations (e.g., at step 70 or 74) to serve as the auxiliary readout operation.

The memory controller uses the readout results of the explicit read thresholds, and the corresponding readout results of the auxiliary threshold(s), to artificially produce readout results for one or more hybrid sets of read thresholds, at a hybrid result generation step 82. Each hybrid set of thresholds comprises at least one threshold selected from the first read thresholds, and at least one threshold selected from the second read thresholds.

Using the multiple readout results, memory controller 40 evaluates the readout performance of the various explicit and hybrid sets of read thresholds, at an optimal threshold selection step 86. Typically, the memory controller selects the set of read thresholds (explicit or hybrid) having the best readout performance, and uses this set for recovering the data stored in the group of memory cells.

In various embodiments, memory controller 40 may evaluate the readout performance in different ways and use different criteria to select the best-performing set of read thresholds. In some embodiments, the data stored in the group of memory cells is encoded with an Error Correction Code (ECC) that is defined by a set of parity check equations. The ECC may comprise, for example, a Low Density Parity Check (LDPC) code, or any other suitable type of ECC.

In some embodiments, for each set of readout results, the memory controller calculates the number (count) of satisfied parity check equations. The set of read thresholds (explicit or hybrid) that produces the readout results having the largest count of satisfied parity check equations is regarded as the best-performing set. Additional aspects of setting read thresholds based on the number of satisfied parity check equations are addressed in U.S. Patent Application Publication 2009/0199074, cited above. This criterion is also referred to as "syndrome sum" (the weight of the syndrome vector, i.e., the sum of locations where the syndrome is equal to 1 and not 0)—Minimizing the syndrome sum is equivalent to finding the readout results having the largest number of satisfied parity check equations.

In alternative embodiments, the memory controller may attempt to decode the ECC for the readout results (whether read or artificially reproduced) of each set of read thresholds (explicit or hybrid). Success or failure to decode the ECC for a given set of readout results is used as an indication of the readout performance of the corresponding set of read thresholds. In an example flow, the memory controller carries out an iterative process of testing additional sets of read thresholds, including both explicit and hybrid sets, until successfully decoding the ECC.

In other embodiments, the memory controller may begin to decode the ECC for the readout results (whether read or artificially reproduced) of each set of read thresholds (explicit or hybrid). When decoding the ECC for a given set of read thresholds, the memory controller may use some interim result of the ECC decoding process as an indication of the readout performance of the corresponding set of read thresholds.

Consider, for example, a configuration in which the stored data is encoded with a Bose-Chaudhuri-Hocquenghem (BCH) code. In a typical BCH decoding process, the decoder calculates an Error Locator Polynomial (ELP), and then locates the errors by finding the roots of the ELP. The rank of the ELP, which is available early in the BCH decoding process, is indicative of the number of errors in the code word. In such embodiments, the memory controller may use the rank of the ELP as an indication of the readout performance of the read thresholds. The memory controller may proceed from this stage. Alternatively, the memory controller may continue to evaluate another set of read threshold without completing the decoding process, even if the previous read results are decodable.

As another example, the ECC may comprise a Turbo Product Code (TPC), in which the data is arranged in a matrix, and each row and column is encoded individually with some auxiliary ECC such as a Hamming code. In these embodiments, the memory controller may decode the auxiliary code only for a subset of the rows and columns of the matrix, and use the decoding results as an indication of readout performance of the read thresholds.

Alternatively to TPC, other types of ECC can also be viewed as a composite ECC comprising multiple component ECCs. The disclosed techniques can be used, mutatis mutandis, with any such ECC. For example, a product code can be defined in more than two dimensions, such as in three dimensions. In an example three-dimensional code, data is arranged in a cube of k·k·k bits, and every k bits in each dimension are encoded into n bits using a component code to generate an n·n·n-bit codeword. Another possible generalization of a two-dimensional product code is to encode the diagonals of the data matrix as a "virtual" $3^{rd}$ dimension, in addition to encoding the rows and columns. As yet another example, a product code can be shortened by refraining from transmitting or storing part of the data bits.

In another embodiment, the disclosed techniques can be used with Generalized Low Density Parity Check (G-LDPC) codes, which can also be viewed as a composite ECC that is made-up of component codes. A G-LDPC code can be described by a Tanner graph. Each check node of this graph, instead of representing a simple parity check equation, represents an ECC (such as Hamming, BCH, RS or convolutional code). A product code can be viewed as a special case of G-LDPC—the "generalized check node" in this case is a Hamming code parity check matrix, for example. The Tanner graph of such a G-LDPC code has all $n^2$ bit nodes on one side, and 2n check nodes on the opposite side. Each check node corresponds to a row or column of the matrix codeword. For example, all the bits of row1 may be connected to a generalized check node, meaning that they are a valid Hamming codeword.

The disclosed techniques can be used with G-LDPC codes: Parameter estimation can be performed based on decoding of part of the generalized check nodes.

Further alternatively, memory controller 40 may evaluate the performance of a given set of read thresholds by estimating the Cumulative Distribution Function (CDF) of the storage values of the relevant memory cells. For example, the memory controller may count the number of "1" readout results in a given group of memory cells and select the read thresholds that make this number closest to a predefined reference number. Examples of CDF-based methods for read threshold adjustment are described, for example, in U.S. Patent Application Publication 2010/0091535, whose disclosure is incorporated herein by reference.

Further alternatively, memory controller 40 may evaluate the readout performance of the various sets of read thresholds, and select the best-performing set of read thresholds, using any other suitable criterion.

When using an ECC that is decoded by syndrome calculation, the memory controller may attempt to decode the ECC based on some hybrid set of read thresholds, and calculate the error vector using the syndrome. If successful, the memory controller may regenerate the read results, and combine them with the error vector so as to produce error-corrected read results.

Generally, the memory controller may continue to evaluate additional sets of read thresholds (explicit of hybrid) even though the data is decodable from a previous set of read results, for example in order to find the best-performing set of read thresholds. In one example embodiment, the current page may be read and decoded using a set of read thresholds that is not necessarily optimal, and the optimal read thresholds will be used for future read operations.

In various embodiments, once the memory controller has identified the best-performing set of read thresholds, it will attempt to decode the ECC based on the readout results obtained using this set. The decoding process used by the memory controller may comprise a hard decoding process or a soft decoding process. In some embodiments, the soft decoding process may involve additional read operations using read thresholds that are positioned in the vicinity of the best-performing set. Alternatively, however, a soft decoding process may operate on hard input, e.g., on hard readout results using only the best-performing threshold set.

In various embodiments, once the best-performing set of read thresholds is found, the memory controller may recover the data from the readout results obtained using these thresholds, if they exist. Alternatively, the memory controller may read the memory cells using the best-performing read thresholds and then recover the data from the readout results. Further alternatively, the memory controller may perform one or more additional read operations with read thresholds that are positioned in the vicinity of the best-performing read thresholds, and recover the data using the readout results of the additional read operations.

Efficient Read Threshold Search by Combining Partial ECC Syndromes from Different Read Operations The description that follows gives an alternative technique of generating artificial readout results for a hybrid set of read thresholds, based on readout results of explicit read thresholds. The disclosed technique is sometimes preferable over the techniques of FIGS. 2-4 above, for example because it does not require storage of the complete sets of readout results obtained using the various explicit read thresholds. This reduction in memory space may be especially significant in high-order MLC (e.g., three or four bits/cell) in which the number of explicit read thresholds (and thus the number of readout results) is high.

The disclosed technique is suitable for use with various criteria of evaluating the readout performance of each threshold set. In some embodiments, the disclosed technique can be used with criteria that are based on non-linear processing of a linear function of the data bits. The syndrome-sum criterion described above, for example, is such a criterion because the ECC syndrome is a linear function of the data bits, but the number of "1" values in the syndrome is a non-linear function of the syndrome.

The term "linearity" in the above paragraph refers to the following: The syndrome calculations are carried out using finite field algebra, and the syndrome is linear in the finite field in the sense that the syndrome of a sum (over the finite field) of two vectors equals the sum of the syndromes of the individual vectors. The syndrome sum, on the other hand, is calculated using algebra of natural numbers, where the binary symbols of the finite field are treated as natural numbers (0 or 1). The syndrome sum is non-linear in the sense that calculating it over the sum (over the finite field) of two bit vectors is not equivalent to adding the syndrome sum of the two individual vectors. The notations of addition and multiplication herein may refer to finite field algebra or to natural or real algebra, as appropriate.

Consider a group of 2 bits/cell memory cells having four programming levels such as the one shown in FIGS. 2 and 3 above, and assume that memory controller 40 reads the group using various explicit sets of MSB read thresholds. In some embodiments, instead of storing the entire vector of readout results for each set of explicit read thresholds, memory controller 40 computes and stores only two partial ECC syndromes.

Let H denote the parity check matrix of the ECC that is used for encoding the data stored in the group of memory cells, and let x denote a vector of MSB readout results using a certain explicit set of read thresholds. The full syndrome of x is defined as $s=H \cdot x$. If x is a valid ECC code word, then $s=H \cdot x=0$. Otherwise, the value of is indicative of the number of parity check equations that are satisfied by x. Typically, the number of non-zero bits in the syndrome indicates the number of non-satisfied equations.

The two partial syndromes of readout results x are defined as $s_1=H \cdot x_1$ and $s_2=H \cdot x_2$, wherein $x_1$ denotes the vector of MSB values of the memory cells for which LSB="0" with the remaining bits nullified, and $x_2$ denotes the vector of MSB values of the memory cells for which LSB="1" with the remaining bits nullified. It can be shown that the sum of the partial syndromes is equal to the full syndrome, since $s=H \cdot x=H \cdot x_1+H \cdot x_2$.

Typically, for each vector x of readout results produced using a certain explicit set of read thresholds, memory controller 40 divides the memory cells in the group into two subsets—One subset for which LSB="0" and another subset for which LSB="1". The memory controller may divide the memory cells by reading the group with an LSB threshold such as threshold 64 in FIG. 2 above. Alternatively, the memory controller may divide the memory cells into the two subsets using an MSB read operation, in accordance with the scheme of FIG. 3 above, or using any other suitable method.

Using this division, the memory controller generates vectors $x_1$ and $x_2$, and then computes the partial syndromes $s_1=H \cdot x_1$ and $s_2=H \cdot x_2$. At this stage, the memory controller may discard the raw read results (x, $x_1$ and $x_2$) and retain only the partial syndromes. This process is typically repeated for each explicit set of read thresholds.

The memory controller may use the stored partial syndromes to evaluate the full syndromes of various hybrid sets of read thresholds, which are formed using combinations of read thresholds from different explicit sets.

Consider, for example, two explicit MSB read operations, the first read operation using read thresholds {V1A,V2A} and the second read operation using read thresholds {V1B, V2B}. For the first read operation the memory controller computes and stores two partial syndromes denoted s1A and s2A. For the second read operation the memory controller computes and stores two partial syndromes denoted s1B and s2B. The memory controller can then compute the full syndrome for the hybrid set {V1A,V2B} by computing s1A+s2B. Similarly, the full syndrome for the hybrid set {V1B, V2A} is given by s1B+s2A.

Since the full syndrome (the sum of the partial syndromes) is indicative of the number of satisfied parity check equations, the memory controller may evaluate the readout performance of various (explicit or hybrid) sets of read thresholds by computing the respective full syndromes associated with these read thresholds. These full syndromes can be calculated by summing the appropriate partial syndromes that were computed for the explicit read thresholds. Typically, the memory controller selects the (explicit or hybrid) set of read thresholds having the smallest full syndrome sum. The selected set of read thresholds is then used for decoding the stored data.

Storing of partial syndromes instead of raw readout results provides considerable saving in memory space. Since the syndrome length is comparable with the ECC redundancy size, it is typically on the order of 3-10% of the data page size.

Although the disclosed technique was described for the case of MSB readout in a 2 bits/cell memory, this choice was made purely for the sake of conceptual clarity. In alternative embodiments, this technique can be used with any other suitable memory configuration. For a 3 bits/cell memory, for example, four partial syndromes are computed and stored for each explicit set of read thresholds.

Figure 5:
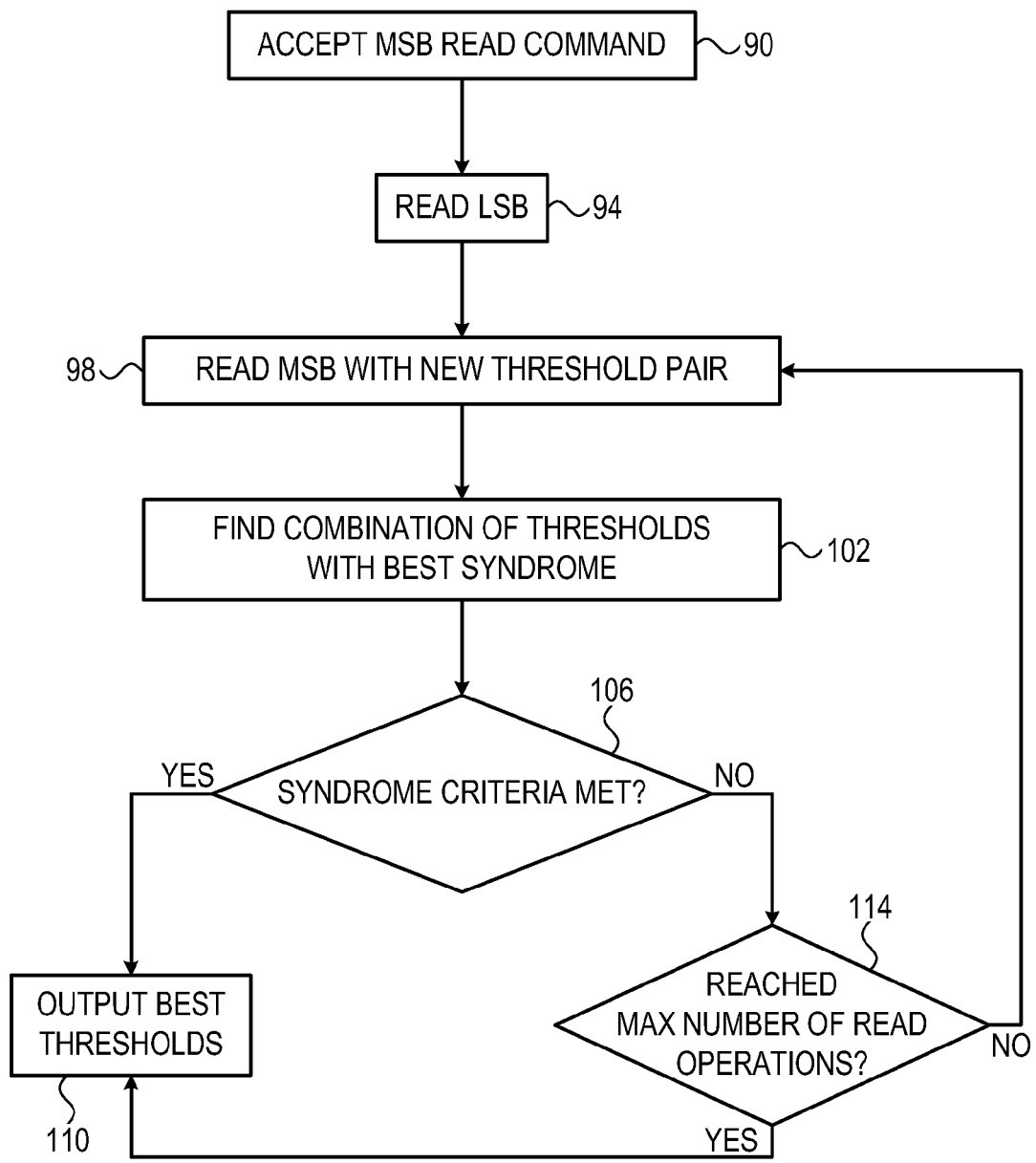

FIG. 5 is a flow chart that schematically illustrates a method for selecting optimal read thresholds, in accordance with an embodiment of the present invention. Although the embodiment described herein refers to partial syndromes, the technique of adding read operations until meeting a certain criterion is not limited for use with partial syndromes, and it is similarly applicable to the syndrome-sum-based method and other methods described above.

The method begins with memory controller 40 accepting an MSB read command from host 52, at a command input step 90. The MSB read command requests readout of the MSB page from a specified group of memory cells.

The memory controller reads the LSB page from the specified group of memory cells, at an LSB readout step 94. The memory controller uses the readout results of the LSB page to divide the memory cells in the group into two subsets, as explained above.

In each pass of the loop of FIG. 5, memory controller 40 reads the group of memory cells using an additional explicit set of MSB read thresholds, at an MSB readout step 98. The memory controller computes and stores the partial syndromes for the new set of explicit read thresholds.

The memory controller finds the (explicit or hybrid) set of read thresholds having the smallest full syndrome sum (sum of partial syndromes), at a syndrome sum minimization step 102. This set is the best-performing set that is achievable using the explicit readout results obtained so far.

The memory controller checks whether the full syndrome with minimal syndrome sum achieved so far meets a pre-defined criterion, at a criterion checking step 106. For example, the memory controller may compare the minimal syndrome sum achieved to an upper tolerable bound, and verify whether the syndrome sum of the best-performing syndrome is smaller than this bound.

If the minimal syndrome sym for the (full) syndrome is sufficiently small, the memory controller outputs the best-performing set of read thresholds (the set of read thresholds associated having the minimal syndrome sum), at an output step 110, and the method terminates.

Otherwise, the memory controller checks whether a maximum allowed number of read operations (a maximum allowed number of explicit read threshold sets) is reached, at a termination checking step 114. If the maximum allowed number of read operations has been reached, the memory controller outputs the best-performing set of read thresholds at step 110, and the method terminates. Otherwise, the method loops back to step 98 above in which the memory controller re-reads the group of memory cells with an additional explicit set of read thresholds.

In various alternative embodiments, the memory controller may decide how many explicit sets are to be used and which hybrid sets (combinations of read thresholds from the explicit sets) should be evaluated. Not all possible combinations need necessarily be tested.

The disclosed techniques are not limited to LDPC codes or to any particular type of ECC. For example, the methods and systems described herein can be used when the stored data is encoded with other types of ECC that are decoded using syndrome calculation, e.g., Bose-Chaudhuri-Hocquenghem (BCH), Reed-Solomon (RS) or Hamming codes.

When carrying out any of the methods described herein, memory controller 40 may combine the readout of multiple explicit sets of read thresholds in a single read command from the memory cells. Consider, for example, a 3 bit/cell memory device, which supports an MSB read commands that reads a group of memory cells using four read thresholds. The memory controller may evaluate two explicit sets of CSB read thresholds (each requiring two thresholds) using a single MSB read command. Additional aspects of readout using multi-threshold commands are addressed in U.S. Pat. No. 8,068,360, which is assigned to the assignee of the present patent application and whose disclosure is incorporated herein by reference.

Although the embodiments described herein mainly address data storage applications and memory devices, the methods and systems described herein can also be used in other applications, such as in receivers of digital communication systems.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   storing data in a group of analog memory cells;
   reading the memory cells in the group using first read thresholds, to produce first readout results;
   re-reading the memory cells in the group using second read thresholds, to produce second readout results;
   defining third read thresholds, which comprise at least one of the first read thresholds and at least one of the second read thresholds;
   evaluating readout performance of the first, second and third read thresholds based on the first and second readout results; and
   selecting the first, second or third read thresholds based on the evaluated readout performance, and performing data recovery using the selected read thresholds.

2. The method according to claim 1, wherein performing the data recovery comprises at least one of:
   recovering the data stored in the group of the memory cells; and
   recovering the data stored in a different group of the memory cells.

3. The method according to claim 1, wherein evaluating the readout performance comprises deriving from the first and second readout results third readout results that would be produced by reading the memory cells in the group using the third read thresholds, and assessing the readout performance based on the third readout results.

4. The method according to claim 3, wherein deriving the third readout results comprises:
   dividing the memory cells in the group into first and second subsets based on readout from the group using one or more auxiliary read thresholds; and
   forming the third readout results by selecting the first readout results read from the memory cells in the first subset, and the second readout results read from the memory cells in the second subset.

5. The method according to claim 4, wherein the auxiliary read thresholds comprise the first or the second set of read thresholds.

6. The method according to claim 1, wherein the stored data is encoded with an Error Correction Code (ECC), and wherein evaluating the readout performance comprises:
   dividing the memory cells in the group into first and second subsets;
   computing a first partial syndrome of the ECC based on the first readout results read from the memory cells in the first subset while nullifying the first readout results read from the memory cells in the second subset;
   computing a second partial syndrome of the ECC based on the second readout results read from the memory cells in the second subset while nullifying the second readout results read from the memory cells in the first subset;
   computing a third syndrome of the ECC, corresponding to third readout results that would be produced by reading the memory cells in the group using the third read thresholds, by summing the first and second partial syndromes; and
   evaluating the readout performance by comparing a first syndrome computed over the first readout results, a second syndrome computed over the second readout results, and the third syndrome.

7. The method according to claim 6, wherein dividing the memory cells in the group into the first and second subsets comprises defining the first and second subsets based on readout from the group using one or more auxiliary read thresholds.

8. The method according to claim 1, wherein the stored data is encoded with an Error Correction Code (ECC) that is defined by a set of parity check equations, and wherein evaluating the readout performance—comprises calculating a respective count of the parity check equations that are satisfied by the first readout results, the second readout results and third readout results that would be produced by reading the memory cells in the group using the third read thresholds.

9. The method according to claim 1, wherein the stored data is encoded with an Error Correction Code (ECC), and wherein evaluating the readout comprises evaluating a success or failure to decode the ECC based on the first, second and third read thresholds.

10. The method according to claim 1, wherein the stored data is encoded with an Error Correction Code (ECC), and wherein evaluating the readout performance—comprises evaluating an interim result of a decoding process that decodes the ECC based on the first, second and third read thresholds.

11. The method according to claim 10, wherein evaluating the interim result comprises calculating a rank of an error locator polynomial of the ECC.

12. The method according to claim 10, wherein the ECC comprises a composite code comprising multiple auxiliary ECCs, and wherein evaluating the interim result comprises evaluating a decoding result of a subset of the multiple auxiliary ECCs.

13. The method according to claim 1, wherein the analog memory cells are comprised in a memory device, and wherein reading and re-reading the memory cells comprise receiving and performing in the memory device a single read command that reads the memory cells using both the first and the second read thresholds.

14. Apparatus, comprising:
a memory, comprising multiple analog memory cells; and
storage circuitry, which is configured to store data in a group of the analog memory cells, to read the memory cells in the group using first read thresholds so as to produce first readout results, to re-read the memory cells in the group using second read thresholds so as to produce second readout results, to define third read thresholds that comprise at least one of the first read thresholds and at least one of the second read thresholds, to evaluate readout performance of the first, second and third read thresholds based on the first and second readout results, to select the first, second or third read thresholds based on the evaluated readout performance, and to perform data recovery using the selected read thresholds.

15. The apparatus according to claim 14, wherein the storage circuitry is configured to perform the data recovery by performing at least one of:
recovering the data stored in the group of the memory cells; and
recovering the data stored in a different group of the memory cells.

16. The apparatus according to claim 15, wherein the storage circuitry is configured to define the first and second subsets based on readout from the group using one or more auxiliary read thresholds.

17. The apparatus according to claim 16, wherein the storage circuitry is configured to divide the memory cells in the group into first and second subsets based on readout from the group using one or more auxiliary read thresholds, and to form the third readout results by selecting the first readout results read from the memory cells in the first subset, and the second readout results read from the memory cells in the second subset.

18. The apparatus according to claim 17, wherein the auxiliary read thresholds comprise the first or the second set of read thresholds.

19. The apparatus according to claim 14, wherein the stored data is encoded with an Error Correction Code (ECC), and wherein the storage circuitry is configured to divide the memory cells in the group into first and second subsets, to compute a first partial syndrome of the ECC based on the first readout results read from the memory cells in the first subset while nullifying the first readout results read from the memory cells in the second subset, to compute a second partial syndrome of the ECC based on the second readout results read from the memory cells in the second subset while nullifying the second readout results read from the memory cells in the first subset, to compute a third syndrome of the ECC, corresponding to third readout results that would be produced by reading the memory cells in the group using the third read thresholds, by summing the first and second partial syndromes, and to evaluate the readout performance by comparing a first syndrome computed over the first readout results, a second syndrome computed over the second readout results, and the third syndrome.

20. The apparatus according to claim 19, wherein the storage circuitry is configured to define the first and second subsets based on readout from the group using one or more auxiliary read thresholds.

21. The apparatus according to claim 14, wherein the stored data is encoded with an Error Correction Code (ECC) that is defined by a set of parity check equations, and wherein the storage circuitry is configured to evaluate the readout performance by calculating a respective count of the parity check equations that are satisfied by the first readout results, the second readout results and third readout results that would be produced by reading the memory cells in the group using the third read thresholds.

22. The apparatus according to claim 14, wherein the stored data is encoded with an Error Correction Code (ECC), and wherein the storage circuitry is configured to evaluate the readout performance by evaluating a success or failure to decode the ECC based on the first, second and third read thresholds.

23. The apparatus according to claim 14, wherein the stored data is encoded with an Error Correction Code (ECC), and wherein the storage circuitry is configured to evaluate the readout performance by evaluating an interim result of a decoding process that decodes the ECC based on the first, second and third read thresholds.

24. The apparatus according to claim 23, wherein the interim result comprises a rank of an error locator polynomial of the ECC.

25. The apparatus according to claim 23, wherein the ECC comprises a composite code comprising multiple auxiliary ECCs, and wherein the interim result comprises a decoding result of only a subset of the multiple auxiliary ECCs.

26. The apparatus according to claim 14, wherein the storage circuitry is configured to perform in the memory a single read command that reads the memory cells using both the first and the second read thresholds.

27. An apparatus, comprising:
an interface, which is configured to communicate with a memory that includes multiple analog memory cells; and
storage circuitry, which is configured to store data in a group of the analog memory cells, to read the memory cells in the group using first read thresholds so as to produce first readout results, to re-read the memory cells in the group using second read thresholds so as to produce second readout results, to define third read thresholds that comprise at least one of the first read thresholds and at least one of the second read thresholds, to evaluate readout performance of the first, second and third read thresholds based on the first and second readout results, to select the first, second or third read thresholds based on the evaluated readout performance, and to perform data recovery using the selected read thresholds.

28. The apparatus according to claim 27, wherein the storage circuitry is configured to derive from the first and second readout results third readout results that would be produced by reading the memory cells in the group using the third read thresholds, and to assess the readout performance based on the third readout results.

* * * * *